United States Patent [19]

Weinberg et al.

[11] Patent Number: 5,783,973
[45] Date of Patent: Jul. 21, 1998

[54] TEMPERATURE INSENSITIVE SILICON OSCILLATOR AND PRECISION VOLTAGE REFERENCE FORMED THEREFROM

[75] Inventors: Marc S. Weinberg, Needham; Paul A. Ward, Roslindale; Anthony S. Kourepenis, Acton, all of Mass.

[73] Assignee: The Charles Stark Draper Laboratory, Inc., Cambridge, Mass.

[21] Appl. No.: 804,796

[22] Filed: Feb. 24, 1997

[51] Int. Cl.$^6$ ............................................. H03L 7/00
[52] U.S. Cl. .................. 331/35; 331/116 M; 331/156; 331/176
[58] Field of Search .................. 331/35, 116 M, 331/156, 176; 327/512, 513, 545, 540; 361/278, 296

[56] References Cited

U.S. PATENT DOCUMENTS

| Re. 32,931 | 5/1989 | Staudte ................................. 73/505 |
| Re. 33,479 | 12/1990 | Juptner et al. ........................... 73/505 |
| 3,053,095 | 9/1962 | Koril et al. ............................... 73/504 |

(List continued on next page.)

FOREIGN PATENT DOCUMENTS

| 55121728 | 9/1980 | Japan .................. H03H 9/19 |
| 58136125 | 8/1983 | Japan .................. H03H 9/17 |
| 59037722 | 3/1984 | Japan .................. H03H 9/17 |
| 59158566 | 9/1984 | Japan .................. H01L 29/84 |
| 61144576 | 7/1986 | Japan .................. G01P 15/09 |
| 62071256 | 8/1987 | Japan .................. H01L 27/06 |
| 62221164 | 9/1987 | Japan .................. H01L 29/84 |
| 63169078 | 7/1988 | Japan .................. H01L 29/84 |
| 2183040 | 5/1987 | United Kingdom ............ G01F 15/02 |
| 9201941 | 2/1992 | WIPO .................. G01P 9/04 |
| 9305401 | 3/1993 | WIPO .................. G01P 9/04 |

OTHER PUBLICATIONS

Barth, P.W. et al., "A Monolithic Silicon Accelerometer With Integral Air Damping and Overrange Protection", 1988 IEEE, pp. 35–38.

Boxenhorn, B. et al., "An Electrostatically Rebalanced Micromechanical Accelerometer", AIAA Guidance, Navigation and Control Conference, Boston, Aug. 14–16, 1989, pp. 118–122.

Boxenhorn, B., et al., "Micromechanical Inertial Guidance System and its Application", Fourteenth Biennial Guidance Test Symposium, vol. 1, Oct. 3–5, 1989, pp. 113–131.

Boxenhorn, B., et al., "Monolithic Silicon Accelerometer", Transducers '89, Jun. 25–30, 1989, pp. 273–277.

Boxenhorn, B., et al., "A Vibratory Micromechanical Gyroscope", AIAA Guidance, Navigation and Control Conference, Minneapolis, Aug. 15–17, 1988, pp. 1033–1040.

Howe, R., et al., "Silicon Micromechanics: Sensors and Actuators on a Chip", IEEE Spectrum, Jul. 1990, pp. 29–35.

Moskalik, L., "Tensometric Accelerometers with Overload Protection", Meas. Tech. (USA), vol. 22, No. 12, Dec. 1979 (publ. 5/80), pp. 1469–1471.

Nakamura, M., et al., "Novel Electrochemical Micro-Machining and Its Application for Semiconductor Acceleration Sensor IC", Digest of Technical Papers (1987), Institute of Electrical Engineers of japan, pp. 112–115.

(List continued on next page.)

*Primary Examiner*—Tan T. Nguyen
*Attorney, Agent, or Firm*—Weingarten, Schurgin, Gagnebin & Hayes LLP

[57] ABSTRACT

Micromachined, thermally insensitive silicon resonators are provided having accuracy equivalent or superior to that of quartz resonators, and are fabricated from a micromechanical, silicon-on-glass process. In one embodiment, such a resonator is realized using a tuning fork gyroscope. Radiation-hard precision voltage references (PVRs) are enabled using the silicon resonators. Thermal sensitivity is reduced relative to that of a silicon-on-silicon process oscillator, providing a thermal sensitivity comparable to that of a quartz oscillator. By employing a micromechanical device based upon a tuning fork gyroscope, resonators are made from either or both of the gyro drive and sense axes. A resonator constructed as an oscillator loop whose resonant frequency is compared to a frequency standard provides a bias voltage as a reference voltage.

16 Claims, 4 Drawing Sheets

U.S. PATENT DOCUMENTS

| | | | |
|---|---|---|---|
| 3,251,231 | 5/1966 | Hunt et al. | 73/505 |
| 3,370,458 | 2/1968 | Dillon | 73/141 |
| 3,696,429 | 10/1972 | Tressa | 343/180 |
| 3,913,035 | 10/1975 | Havens | 331/107 R |
| 4,044,305 | 8/1977 | Oberbeck | 324/154 R |
| 4,122,448 | 10/1978 | Martin | 343/7.7 |
| 4,144,764 | 3/1979 | Hartzell, Jr. | 73/497 |
| 4,155,257 | 5/1979 | Wittke | 73/497 |
| 4,234,666 | 11/1980 | Gursky | 428/573 |
| 4,321,500 | 3/1982 | Paros et al. | 310/321 |
| 4,336,718 | 6/1982 | Washburn | 73/517 B |
| 4,342,227 | 8/1982 | Petersen et al. | 73/510 |
| 4,381,672 | 5/1983 | O'Connor et al. | 73/505 |
| 4,406,992 | 9/1983 | Kurtz et al. | 338/2 |
| 4,411,741 | 10/1983 | Janata | 204/1 T |
| 4,414,852 | 11/1983 | McNeill | 73/765 |
| 4,447,753 | 5/1984 | Ochiai | 310/312 |
| 4,468,584 | 8/1984 | Nakamura et al. | 310/370 |
| 4,478,076 | 10/1984 | Bohrer | 73/204 |
| 4,478,077 | 10/1984 | Bohrer et al. | 73/204 |
| 4,483,194 | 11/1984 | Rudolf | 73/517 R |
| 4,484,382 | 11/1984 | Kawashima | 29/25.35 |
| 4,490,772 | 12/1984 | Blickstein | 361/281 |
| 4,495,499 | 1/1985 | Richardson | 343/5 DD |
| 4,499,778 | 2/1985 | Westhaver et al. | 74/5 F |
| 4,502,042 | 2/1985 | Wuhrl et al. | 340/568 |
| 4,522,072 | 6/1985 | Sulouff et al. | 73/765 |
| 4,524,619 | 6/1985 | Staudte | 73/505 |
| 4,538,461 | 9/1985 | Juptner et al. | 73/505 |
| 4,585,083 | 4/1986 | Nishiguchi | 177/229 |
| 4,590,801 | 5/1986 | Merhav | 73/510 |
| 4,592,242 | 6/1986 | Kempas | 74/5 F |
| 4,596,158 | 6/1986 | Strugach | 74/5 F |
| 4,598,585 | 7/1986 | Boxenhorn | 73/505 |
| 4,600,934 | 7/1986 | Aine et al. | 357/26 |
| 4,619,001 | 10/1986 | Kane | 455/192 |
| 4,621,925 | 11/1986 | Masuda et al. | 356/350 |
| 4,628,283 | 12/1986 | Reynolds | 331/68 |
| 4,629,957 | 12/1986 | Walters et al. | 318/662 |
| 4,639,690 | 1/1987 | Lewis | 331/96 |
| 4,644,793 | 2/1987 | Church | 73/505 |
| 4,651,564 | 3/1987 | Johnson et al. | 73/204 |
| 4,652,837 | 3/1987 | D'Arrigo et al. | 331/111 |
| 4,653,326 | 3/1987 | Danel et al. | 73/517 R |
| 4,654,663 | 3/1987 | Alsenz et al. | 340/870.3 |
| 4,665,605 | 5/1987 | Kempas | 29/643 |
| 4,670,092 | 6/1987 | Motamedi | 156/643 |
| 4,671,112 | 6/1987 | Kimura et al. | 73/505 |
| 4,674,180 | 6/1987 | Zavracky et al. | 29/622 |
| 4,674,319 | 6/1987 | Muller et al. | 73/23 |
| 4,679,434 | 7/1987 | Stewart | 73/517 B |
| 4,680,606 | 7/1987 | Knutti et al. | 357/26 |
| 4,699,006 | 10/1987 | Boxenhorn | 73/517 AV |
| 4,705,659 | 11/1987 | Bernstein et al. | 264/29.6 |
| 4,706,374 | 11/1987 | Murkami | 437/225 |
| 4,712,439 | 12/1987 | North | 74/84 R |
| 4,727,752 | 3/1988 | Peters | 73/517 AV |
| 4,735,506 | 4/1988 | Pavlath | 356/350 |
| 4,736,629 | 4/1988 | Cole | 73/517 R |
| 4,743,789 | 5/1988 | Puskas | 310/316 |
| 4,744,248 | 5/1988 | Stewart | 73/505 |
| 4,744,249 | 5/1988 | Stewart | 73/505 |
| 4,747,312 | 5/1988 | Herzl | 73/861.38 |
| 4,750,364 | 6/1988 | Kawamura et al. | 73/510 |
| 4,761,743 | 8/1988 | Wittke | 364/484 |
| 4,764,244 | 8/1988 | Chitty et al. | 156/630 |
| 4,776,924 | 10/1988 | Delapierre | 156/647 |
| 4,783,237 | 11/1988 | Aine et al. | 437/15 |
| 4,789,803 | 12/1988 | Jacobsen et al. | 310/309 |
| 4,792,676 | 12/1988 | Hojo et al. | 250/231 GY |
| 4,805,456 | 2/1989 | Howe et al. | 73/517 AV |
| 4,808,948 | 2/1989 | Patel et al. | 331/4 |
| 4,815,472 | 3/1989 | Wise et al. | 128/675 |
| 4,834,538 | 5/1989 | Heeks et al. | 356/350 |
| 4,847,571 | 7/1989 | Stevance et al. | 331/96 |
| 4,851,080 | 7/1989 | Howe et al. | 156/647 |
| 4,855,544 | 8/1989 | Glenn | 200/61.45 R |
| 4,869,107 | 9/1989 | Murakami | 73/517 R |
| 4,881,410 | 11/1989 | Wise et al. | 73/724 |
| 4,882,933 | 11/1989 | Petersen et al. | 73/517 R |
| 4,884,446 | 12/1989 | Ljung | 73/505 |
| 4,890,812 | 1/1990 | Chechile et al. | 248/674 |
| 4,893,509 | 1/1990 | MacIver et al. | 73/517 AV |
| 4,898,032 | 2/1990 | Voles | 73/505 |
| 4,899,587 | 2/1990 | Staudte | 73/505 |
| 4,900,971 | 2/1990 | Kawashima | 310/361 |
| 4,901,586 | 2/1990 | Blake et al. | 73/862.59 |
| 4,905,056 | 2/1990 | Berndt et al. | 357/4 |
| 4,916,520 | 4/1990 | Kurashima | 357/71 |
| 4,922,756 | 5/1990 | Henrion | 73/517 R |
| 4,929,860 | 5/1990 | Hulsing, II et al. | 310/366 |
| 4,948,989 | 8/1990 | Spratt | 307/296.6 |
| 4,981,359 | 1/1991 | Tazartes et al. | 356/350 |
| 4,988,957 | 1/1991 | Thompson et al. | 331/107 |
| 5,001,383 | 3/1991 | Kawashima | 310/367 |
| 5,013,396 | 5/1991 | Wise et al. | 156/628 |
| 5,016,072 | 5/1991 | Greiff | 357/26 |
| 5,025,346 | 6/1991 | Tang, et al. | 361/283 |
| 5,038,613 | 8/1991 | Takenaka et al. | 73/510 |
| 5,047,661 | 9/1991 | Berndt et al. | 307/296.6 |
| 5,055,838 | 10/1991 | Wise et al. | 340/870 |
| 5,060,039 | 10/1991 | Weinberg et al. | 357/26 |
| 5,075,641 | 12/1991 | Weber et al. | 331/108 |
| 5,090,809 | 2/1992 | Ferrar | 356/350 |
| 5,094,537 | 3/1992 | Karpinski, Jr. | 356/350 |
| 5,138,883 | 8/1992 | Paquet et al. | 73/504 |
| 5,142,921 | 9/1992 | Stewart et al. | 73/866 |
| 5,146,297 | 9/1992 | Collins et al. | 357/13 |
| 5,195,371 | 3/1993 | Grieff | 73/505 |
| 5,203,208 | 4/1993 | Bernstein | 73/505 |
| 5,205,171 | 4/1993 | O'Brien et al. | 73/517 B |
| 5,216,490 | 6/1993 | Greiff, et al. | 73/517 R |
| 5,226,321 | 7/1993 | Varnham et al. | 73/505 |
| 5,233,874 | 8/1993 | Putty et al. | 73/517 AV |
| 5,241,861 | 9/1993 | Hulsing, II | 73/505 |
| 5,258,702 | 11/1993 | Conzelmann et al. | 323/313 |
| 5,491,604 | 2/1996 | Nguyen et al. | 331/116 M |
| 5,576,250 | 11/1996 | Diem et al. | 437/228 |
| 5,656,778 | 8/1997 | Roszhart | 73/504.04 |

OTHER PUBLICATIONS

Peterson, K.E., et al., "Micromechanical Accelerometer Integrated with MOS Detection Circuitry", IEEE, vol. ED-29 No. 1 (Jan. 1982), pp. 23–27.

Peterson, Kurt E., et al., "Silicon as a Mechanical Material", *Proceedings of the IEEE*, vol. 70, No.5, May 1982 pp. 420–457.

"Quartz Rate Sensor Replaces Gyros", *Defense Electronics*, Nov. 1984, p. 177.

Rosen, Jerome, "Machining In the Micro Domain", *Mechanical Engineering*, Mar. 1989, pp. 40–46.

Teknekron Sensor Development Corporation, article entitled "Micro–Vibratory Rate Sensor", 1080 Marsh Road, Menlo Park, CA 94025, 2 pages, undated.

Bryzek, Janusz et al., "Micromachines on the March", IEEE Spectrum, May 1994, pp. 20–31.

IEEE Robotics & Automation Soc, in coop. w/ASME Dynamic Systems & Control Div., "Micro Electro Mechanical Systems, An Investigation of Mirco Structures, Sensors, Actuators, Machines and Systems", IEEE Cat. #93CH3265–6, Library of Congress #92–56273, Ft. Lauderdale, Fl. Feb. 7–10 1993.

TEMPERATURE INSENSITIVE SILICON OSCILLATOR AND PRECISION VOLTAGE REFERENCE FORMED THEREFROM

FIELD OF THE INVENTION

The present invention relates to frequency and voltage references, and in particular to temperature insensitive oscillators and radiation-hard precision voltage references formed from a micromechanical gyroscope.

BACKGROUND OF THE INVENTION

Tuning forks used for time keeping in watches, clocks, and computers are presently made of quartz. Such quartz oscillators are sufficiently accurate for most typical applications and are relatively inexpensive to fabricate. For instance, quartz flexures oriented properly with respect to crystallographic axes have a resonant frequency linear thermal variation of zero and a second order frequency sensitivity of $-0.035$ ppm/°C.$^2$.

However, relatively few suppliers exist for thermally insensitive quartz. Further, quartz oscillators are typically too large (3 to 5 mm in length, formed from one inch wafers) for micromechanical implementations. Such larger devices increase system expense in some applications by requiring more area on a substrate, and are themselves more expensive to fabricate than silicon devices.

Additionally, known quartz resonators cannot be employed to realize radiation hard precision voltage references (PVRs). In fact, none of the currently available PVRs are radiation hard, but rather exhibit large PVR shifts under radiation. For example, PVRs based on compensated avalanche diodes, tunnel diodes, nuclear magnetic resonance spectroscopy, and electron spin resonance have failed to satisfy requirements for radiation hardness in strategic missile guidance systems. Further, such PVRs are of greater bulk than ideally desired, and require special doping profiles, leading to increased cost. In contrast, mechanical resonant frequencies are not subject to shifts under radiation.

SUMMARY OF THE INVENTION

According to the present invention, micromachined, thermally insensitive silicon resonators are provided having accuracy equivalent or superior to that of currently employed, thermally varying quartz resonators. By employing a micromechanical device based upon a tuning fork gyroscope such as that disclosed in commonly assigned U.S. Pat. No. 5,349,855, resonators are made from either or both of the gyro drive and sense axes. Further, such resonators are employed in the creation of radiation-hard precision voltage references (PVRs).

A tuning fork gyroscope constructed on a glass substrate and having proper flexure design, according to the present invention, provides a thermal sensitivity in the silicon oscillators approximately two orders of magnitude below that of a silicon oscillator fabricated according to silicon-on-silicon processes. This reduced thermal sensitivity is comparable to that of a quartz oscillator.

Silicon tuning forks (0.3 to 2 mm) are smaller than quartz tuning forks (3 to 5 mm), and thus are less expensive to incorporate into a densely packed circuit or small device. Further, a greater number of organizations are fabricating silicon versus quartz, so that temperature insensitive oscillators and radiation hard PVRs could be more widely available. Such availability results in a lower cost for silicon devices compared to comparable quartz devices.

The tuning fork gyroscope provides two second order systems, each of which can be used as a resonator. For a first resonator, a gyroscope proof mass is driven and sensed along a Y axis orthogonal to the plane of the glass substrate. For a second resonator, comb drive and sense capabilities are utilized along a plane parallel to the glass substrate. By properly combining Young's modulus variation, thermal expansion difference, and strain relief, resonant frequency thermal sensitivity is greatly reduced.

A first PVR is fashioned from the first, Y axis resonator. When operated with relatively large excitations, the resonant frequency of the temperature insensitive silicon resonator varies with the voltage bias. When constructed as an oscillator loop whose resonant frequency is compared to a frequency standard, the bias voltage, adjusted to maintain the resonant frequency, becomes the reference voltage.

A second PVR is fashioned from the second, X axis resonator. However, suspension beam stiffness becomes non-linear at larger excitation amplitudes along the X axis. Damping and ambient pressure must be tightly controlled to prevent the varying of the drive amplitude and resonant frequency. Thus, the first PVR is preferred.

BRIEF DESCRIPTION OF THE DRAWINGS

These and other features of the present invention are more fully set forth below in the fully exemplary detailed description and accompanying drawings of which.

DETAILED DESCRIPTION

The present invention contemplates a micromachined, thermally insensitive silicon resonator of silicon-on-glass fabrication having accuracy equivalent or superior to that of currently employed, thermally varying quartz resonators. In one embodiment, such a resonator is realized using a micromechanical, silicon-on-glass tuning fork gyroscope.

Figure 1:
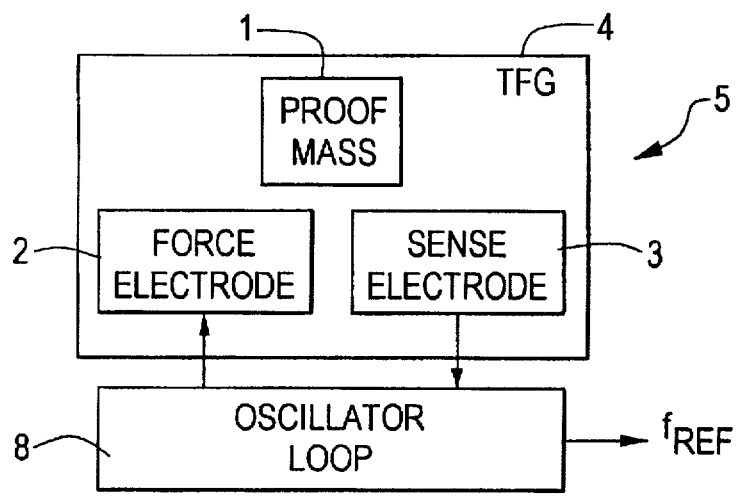
FIG. 1 is a schematic view of a tuning fork gyroscope according to the invention configured for use as a reference oscillator.

In general and with reference to FIG. 1, a first thermally insensitive reference oscillator 5 is implemented by providing a reference voltage from an oscillator loop 8 to at least one sense or drive axis force electrode 2 of a micromechanical silicon tuning fork gyroscope (TFG) 4 fabricated on a glass substrate. The force electrode 2 imparts motive force on a vibratory mass referred to above as a proof mass 1, wherein the proof mass 1 vibrates at a resonant frequency. At least one sense electrode 3 disposed proximate the proof mass 1 detects this oscillation, and returns a signal, modulated at the resonant frequency, to the oscillator loop 8 at a reference frequency $f_{REF}$. The sense electrode 3 is connected to the drive electrode 2 through the oscillator loop 8. The mechanical frequency of oscillation and electrical output $f_{REF}$ are identical.

Other embodiments of the illustrated reference oscillator are fabricated from silicon-on-glass devices other than the aforementioned comb-drive tuning fork gyroscope.

The present invention further contemplates a radiation-hard precision voltage reference (PVR) which is fabricated from a micromachined, thermally insensitive silicon resonator of silicon-on-glass fabrication, such as that shown schematically in FIG. 1. Because mechanical resonant frequencies are not changed by radiation, the PVR is radiation hard. Once again, a micromechanical, silicon-on-glass tuning fork gyroscope is employed in the realization of a first embodiment of the PVR, though other silicon-on-glass configurations are employable in alternative embodiments.

Figure 2:
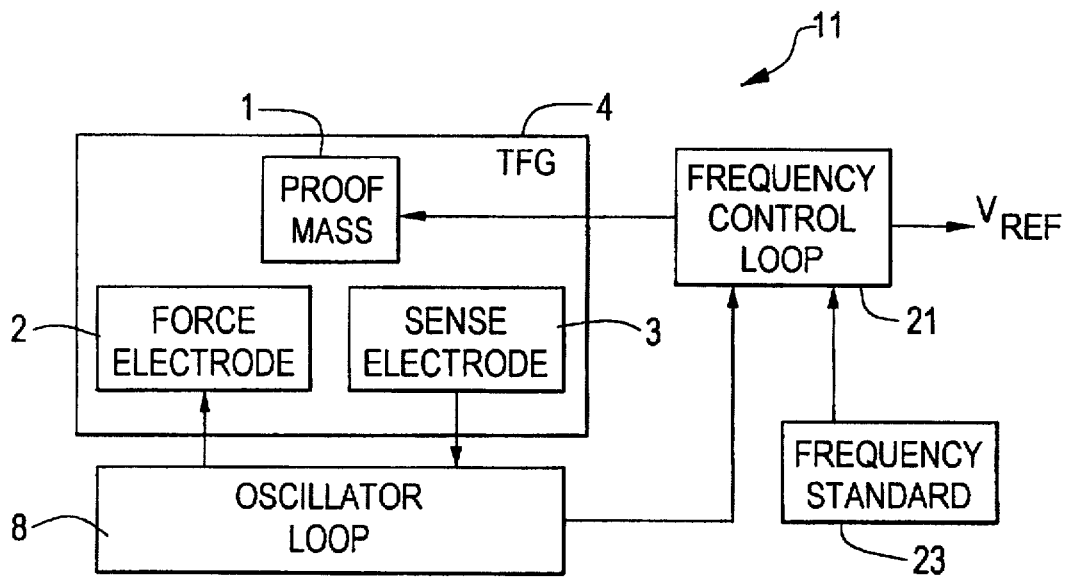
FIG. 2 is a schematic view of the tuning fork gyroscope of FIG. 1 configured for use as a precision voltage reference.

In FIG. 2, a precision voltage reference (PVR) 11 is fabricated from the silicon-on-glass, micromechanical tuning fork gyroscope (TFG) 4. As with the reference oscillator 5 just described, a proof mass 1 is excited into resonant motion by way of at least one energized force electrode 2 along either the sense or drive axes. An oscillator loop 8 provides the AC excitation energy in this first embodiment. A frequency control loop 21 compares a reference frequency $f_{REF}$ from a frequency standard 23 to a sensed proof mass oscillation frequency from the oscillator loop 8, and a DC correction signal is applied to the proof mass 1. Thus, the detected frequency of oscillation is synchronized with a reference frequency by adjusting an applied DC bias, which is then available as a reference voltage $V_{REF}$.

The gyroscope employed in such realizations is a tuning fork gyroscope in which drive and driven electrode pairs, responsible for imparting vibrational motion to the tuning fork vibrating elements, are formed by plural respective interleaved fingers which greatly increase the area and capacitance as well as capacitance change with motion of the device so as to substantially enhance the system sensitivity. In addition, such a drive structure is consistent with fabrication techniques that allow for a greater mass to the vibrating element which cooperates with the higher efficiency drive in providing an increased sensitivity. The tuning fork structure has a high mechanical quality factor (Q), due to the opposing motion which tends to reduce the stress reaching the support points and hence reduce the coupling of energy out of the structure.

The frequency stability of silicon flexures in a micromechanical device is significantly effected by the thermal sensitivity of Young's modulus. For a polysilicon oscillator structure disposed on a silicon substrate, frequency stability on the order of $-10$ ppm/°C. is typical. However, for a clock employing such an oscillator to be accurate to ten seconds per month requires frequency accuracy of 4 ppm over thermal variation, a figure routinely achieved by quartz tuning forks. By building tuning forks on a glass substrate and by employing proper flexure mechanical design, both as addressed herein, the thermal sensitivity of silicon oscillators is reduced two orders of magnitude to a performance level comparable with that of quartz.

Figure 3:
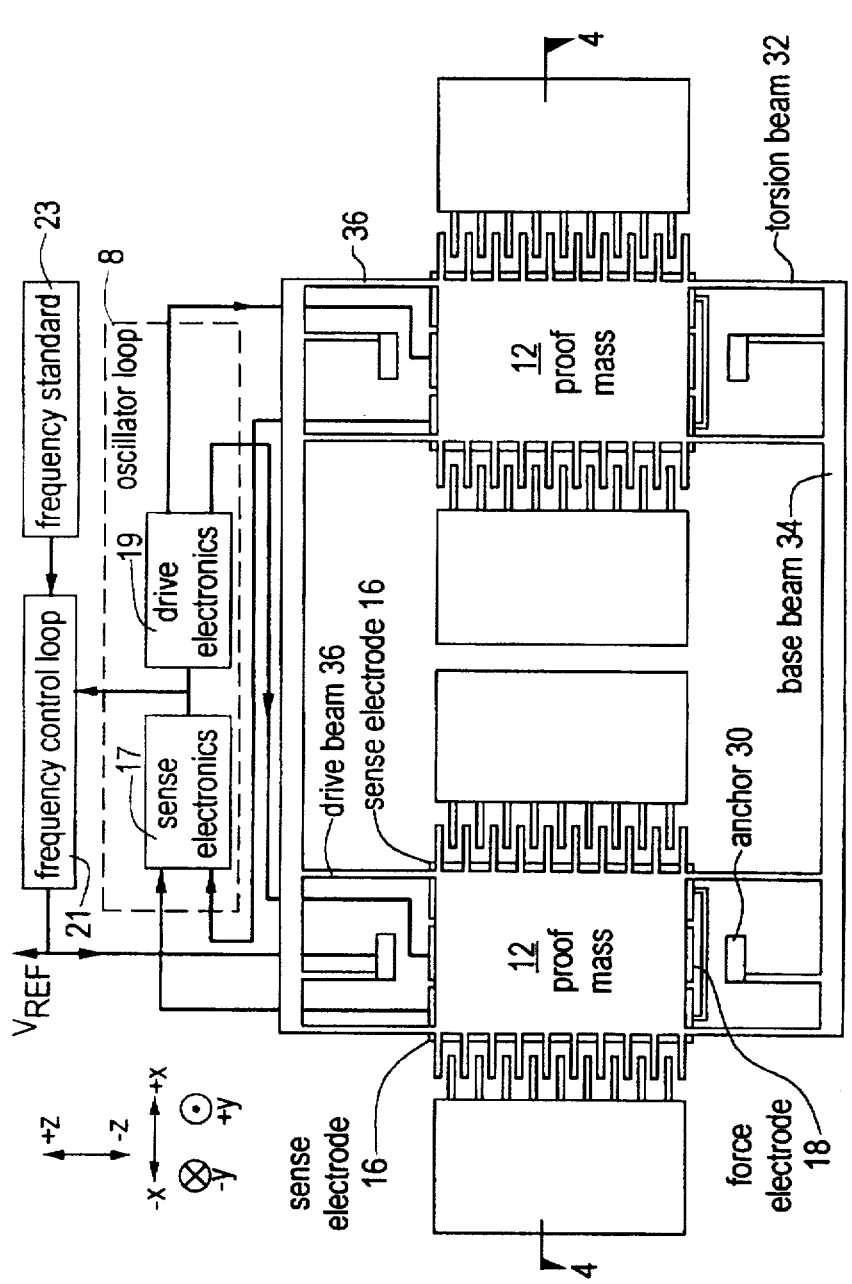
FIG. 3 is a top diagrammatic view of a first embodiment of a micromechanical comb drive tuning fork inertial rate sensor adapted for use as a thermally insensitive reference oscillator and radiation-hard precision voltage reference.
Figure 4:
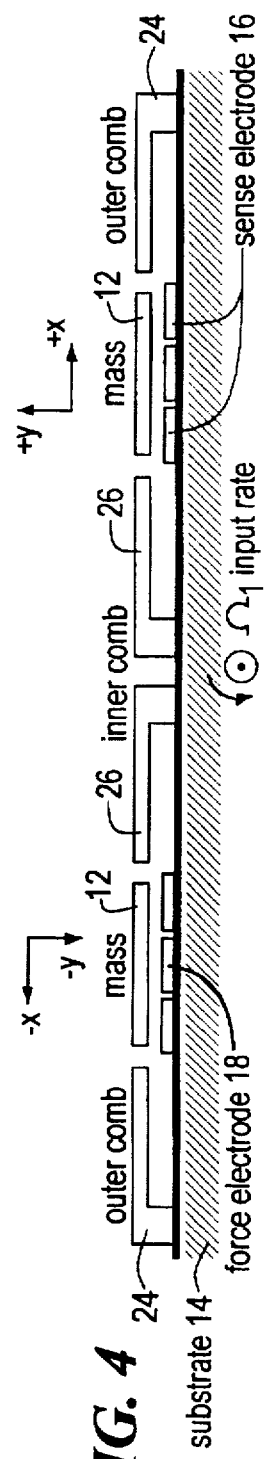
FIG. 4 is a section view of the inertial rate sensor of FIG. 3 taken along lines 4—4.
Figure 5:
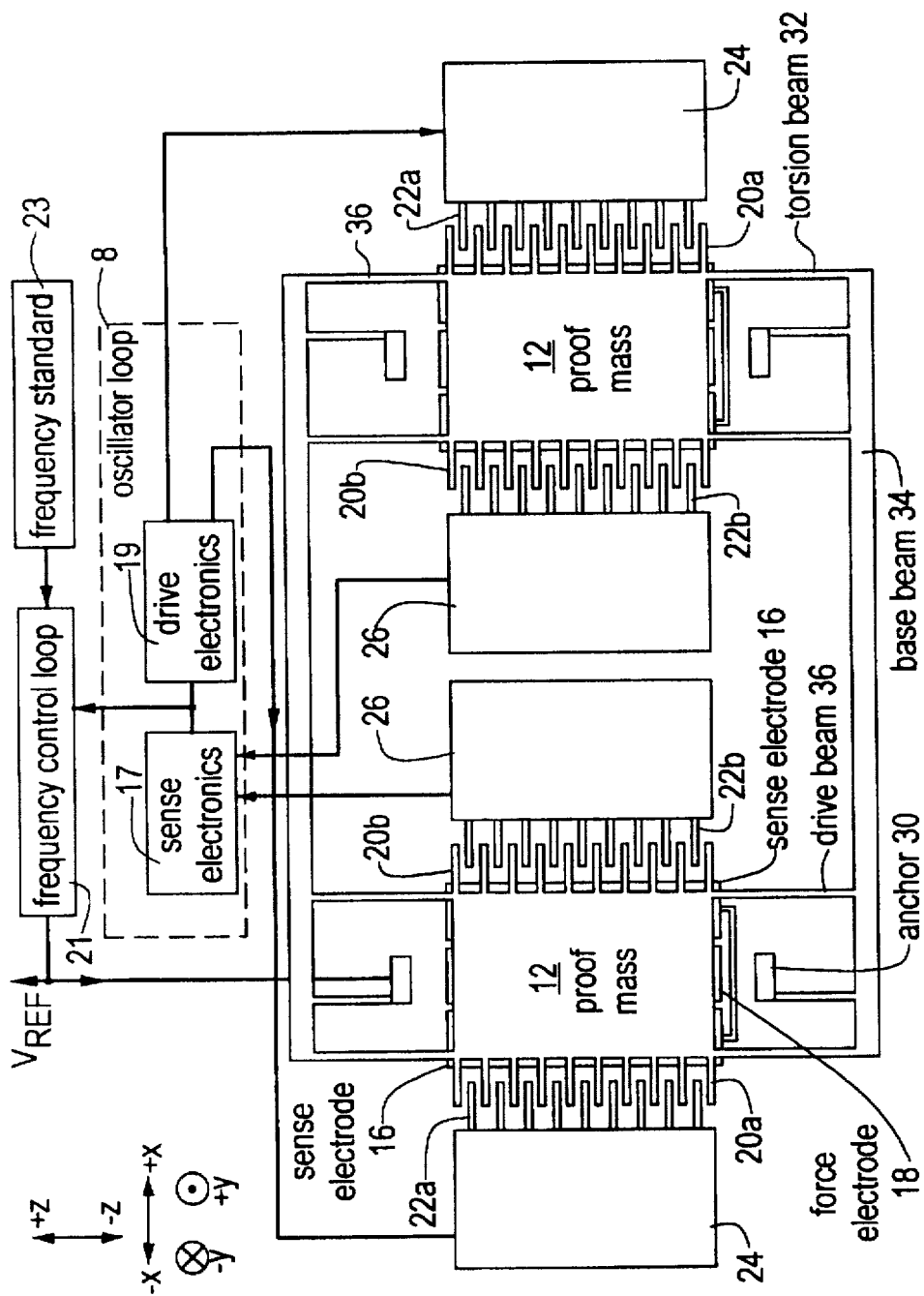
FIG. 5 is a top diagrammatic view of a second embodiment of a micromechanical comb drive tuning fork inertial rate sensor adapted for use as a thermally insensitive reference oscillator and radiation-hard precision voltage reference.

Alternative embodiments of a tuning fork rate sensitive structure 10 suitable for use in the realization of a thermally insensitive oscillator and a radiation hard, precision voltage reference (PVR) according to the present invention are illustrated in FIGS. 3, 4 and 5. The principles disclosed and claimed herein with respect to the depicted device 10 are equally applicable to other micromechanical device embodiments, though the test results presented are for the embodiment of FIGS. 3, 4 and 5 only.

The gyroscope 10 comprises the following functional elements, illustrated with respect to FIGS. 3, 4 and 5. Two proof masses 12 are each suspended above a glass substrate 14, and provide motion along two axes, X and Y. With regard to FIGS. 3 and 4, in which motion along the Y axis is utilized, sense 16 and force 18 electrodes are disposed on the glass substrate 14, substantially beneath respective proof masses 12, for imparting and detecting proof mass 12 motion along the Y axis. The sense electrodes 16 provide information to sense electronics 17. The force electrodes 18, alternatively referred to as drive electrodes, are driven by drive electronics 19. Collectively, the sense and drive electronics comprise the oscillator loop 8 illustrated in FIGS. 1 and 2. As in FIG. 2, the sense electronics 17 output is analyzed within the frequency control loop 21 with respect to the frequency standard 23 output in order to generate a DC bias. This bias is applied to the proof mass 12 and serves as the reference voltage output ($V_{REF}$).

In FIG. 5, motion along the X axis is employed to implement the reference oscillator and PVR. Here, each proof mass 12 is provided with a plurality of proof mass fingers 20a, 20b extending along the X axis. These proof mass fingers 20a, 20b are arranged as outer proof mass fingers 20a and inner proof mass fingers 20b. Interspersed between the outer proof mass fingers 20a are outer fixed comb fingers 22a extending from outer fixed combs 24. Interspersed between the inner proof mass fingers 20b are inner fixed comb fingers 22b extending from inner fixed combs 26. The outer fixed combs 24 are connected to the drive electronics 19 of the oscillator loop 8 and act as drive sources, so that the outer fixed comb fingers 22a act as drive electrodes. The capacitive effect between the outer fixed comb fingers 22a and the outer proof mass fingers 20a results in proof mass motion along the X axis.

This motion is detected by using the inner fixed combs 26 as sense devices and the inner fixed comb fingers 22b as sense electrodes, connected to the sense electronics 17. Capacitive variation sensed by the inner fixed comb fingers 22b provides an indication of proof mass 12 X axis motion. The interleaved fingers 20a, 20b, 22a, 22b provide increased surface area for creation of capacitance and detection of capacitive change with motion of the device, substantially increasing the sensitivity of the device. As in FIG. 3, the sensed frequency from the sense electronics 17 is analyzed in the frequency control loop 21 with respect to the frequency standard 23 to generate the reference voltage.

Alternative labels include electrical signal source for drive electronics, and frequency module for sense electronics.

In a further embodiment of the device of FIG. 3, in which only movement substantially parallel to the Y-axis is employed, the inner and outer proof mass fingers 20a, 20b, the outer and inner fixed comb fingers 22a, 22b, and the outer and inner fixed combs 24, 26 are omitted. Only the electronics necessary for operating the device in the Y axis are provided.

Similarly, in an alternative embodiment of the device of FIG. 5, the underlying sense and force electrodes 16, 18 are omitted. Only the electronics for operating the device in the X axis are provided.

A further embodiment of the present invention includes all of the force and sense elements of FIGS. 3 and 5, along with the respective electronics, such that this embodiment can be configured for use as a reference oscillator or a PVR, operating in either the Y or X axes.

To enable free movement of the proof masses 12 in both the X and Y axes, the proof masses 12 are suspended from a system of beams and anchors. Specifically, four anchors 30 are disposed on the glass substrate 14, proximate the electrodes 16, 18 disposed on the substrate 14. Extending away from each anchor 30 and the proximate electrodes 16, 18 are torsion beams 32. Disposed from the torsion beams 32 laterally along the X axis are base beams 34. Finally, extending between the base beams 34 and each proof mass 12 are pairs of drive beams 36. Thus, proof mass 12 motion along both the X and Y axes is accommodated by the drive beams 36. Any residual strain or torque not compensated for by the drive beams 36 and conveyed through the base beams 34 is absorbed by the torsion beams 32.

The flat force drive electrodes 18 deposited on the substrate 14 drive the proof mass Y motion which is sensed by the proximate sense electrodes 16 (FIGS. 3 and 4). The outer fixed combs 24 drive proof mass 12 motion along the X axis, parallel to the surface of the substrate 14, which is detected by the inner fixed combs 26 (FIG. 5).

As previously indicated, if the substrate and micromachined parts are both made of silicon by a silicon-on-silicon technique, the resonant frequencies of both modes change on the order of –50 ppm/°C. (negative coefficient) because of Young's modulus variation. This variation is significantly poorer than that achieved by quartz and required for many applications. Therefore, it is preferred to fabricate the sensor device of the present invention according to a silicon-on-glass technique, using, for instance, Pyrex™ (Corning) or similar glass as the substrate.

Two features are of great importance in fabricating a thermally insensitive oscillator. The first is the use of glass as substrate 14. The thermal coefficient of glass is on the order of 0.8 ppm/°C. greater than that of crystalline silicon so that the Young's modulus and thermal expansion effects on device resonant frequency are opposite and self-cancelling.

Second, the thermal expansion effect within the slender beams 32, 34, 36 required for usable frequencies is much larger than that of the Young's modulus if straight beams are fastened directly to the substrate 14. The suspension beam geometry as illustrated in FIGS. 3 and 5, wherein each proof mass 12 is suspended by not just one straight beam but by a combination of three beams 32, 34, 36, results in axial strain in the suspension beams which is lower than that of the glass substrate 14. Further compensation for stress and torque can be incorporated into the presently illustrated gyroscope, such as by the use of folded support springs.

Both resonators (FIGS. 3 and 5) have nonlinear stiffness so that the resonant frequency is a function of drive amplitude. This topic, briefly introduced here, is discussed in greater detail below. For simple oscillators, requirements for amplitude control are not stringent. With regard to the drive electronics for the X axis oscillator, the change in resonant frequency w with drive amplitude x is described by:

$$\frac{\Delta \omega}{\omega} = 0.04 \left( \frac{x}{10 \mu m} \right)^2 \quad (1)$$

For the illustrated rate sensitive device configuration, the value of 0.04 holds, though this value can be adjusted according to device design.

Assuming 2 μm amplitude with stability of 0.1%, the resonant frequency stability is 3.2 ppm, thus indicating that the requirements for drive axis amplitude are not stringent. High aspect ratio comb fingers further improve the capacitive sensitivity.

Frequency variation with drive amplitude A for a sense or Y axis oscillator is described by:

$$\frac{\Delta \omega}{\omega} = \frac{3k_e}{4k_n} \left( \frac{y}{h} \right)^2 \quad (2)$$

where
 $k_e$=stiffness from electrostatic fields
 $k_n$=net mechanical and electrical stiffness
 ω=resonant frequency.

For a tuning fork rate sensitive structure 10 as depicted with 5 V sense bias, the ratio of electric field to total stiffness is 0.024. Assuming the ratio of amplitude to nominal gap is 10% and that the amplitude is controlled to 0.1%, the change in eigenfrequency is 0.36 ppm.

Changes in package pressure affect damping, which in turn alters the force-displacement relationship at resonance. In environments where significant pressure differentials are expected, gain or amplitude control (not illustrated) is provided to the drive electronics so that pressure variations do not change the drive amplitude. As damping increases, the required drive voltage will increase. However, the effect of drive voltage on eigenfrequency is small. Gyro pressure variation does not then affect amplitude so that resonant frequency is not affected. Further, the effect of small thermal variations does not change the damping significantly.

When the Young's modulus variation, thermal expansion difference, and strain relief are combined properly, the thermal sensitivity of the resonant frequency is greatly reduced, by approximately one to two orders of magnitude. Thus, the performance of oscillators formed from the silicon tuning fork approaches or exceeds that of quartz oscillators.

A first precision voltage reference (PVR) employs the Y axis, or sense mode, of the gyroscope of FIGS. 3 and 4. The sense and force functions are based on capacitive changes as the proof mass 12 moves normal to the plane of the sense and drive electrodes 16, 18. When a bias voltage is applied to the sense electrodes 16, the electrostatic force acts as a negative spring proportional to the bias voltage squared. When the bias voltage is raised to the snap down voltage, the negative electrical spring overcomes the positive mechanical spring and the proof mass is unstable. The micromechanical device employed enables a PVR operable at reasonable voltages (e.g. 0–20 VDC). Silicon-on-Pyrex™ is an exemplary micromechanical device method. For the TFG embodiment 10 illustrated in FIGS. 3 and 5, the snap down voltage is on the order of 18 V. Setting the sense electrode bias to 16 V results in an acceptable PVR where the resonant frequency is 21 kHz, compared to 28 kHz without electrical bias.

When operated with large excitations, the resonant frequency of the temperature insensitive silicon oscillator varies with voltage bias. As the bias approaches snap down, the eigenfrequency drops sharply. It is thus desired to operate close, but not too close, to snap down. For the illustrated embodiment, assume that the resonator is oscillating at 21.1 kHz, corresponding to 16.05 V bias or 90.2% of snap down. At a bias of 16 V, the 2.5 μm air gap between proof mass 12 and the substrate 14 decreases 0.45 μm. The resonant frequency changes –2.190 Hz/V. Assume that the desired voltage stability is 0.2 ppm. The corresponding $$\frac{\Delta f}{f} = \frac{16.05V \times 0.2ppm \times 2190 \frac{Hz}{V}}{21.1 kHz} = 0.32 ppm \quad (3)$$

Compared to existing data on quartz and silicon resonators, 0.3 ppm is achievable.

The mechanical oscillator as previously described is configured into a voltage controlled oscillator loop via a feedback circuit 21, or frequency comparator, disposed between the sense electronics 17 and the drive electronics 19. The resonant frequency from the sense electronics is compared to a frequency standard 23. The bias voltage, which is treated as the reference voltage and is output from the drive electronics 19, is adjusted to maintain the resonant frequency. Since the resonator is very stable and since frequency can be measured accurately, the precision voltage reference is realized.

To reiterate, the presently recited figures are for the illustrated device embodiments. Other device embodiments are possible, each having its own unique set of parameter values.

Figure 6:
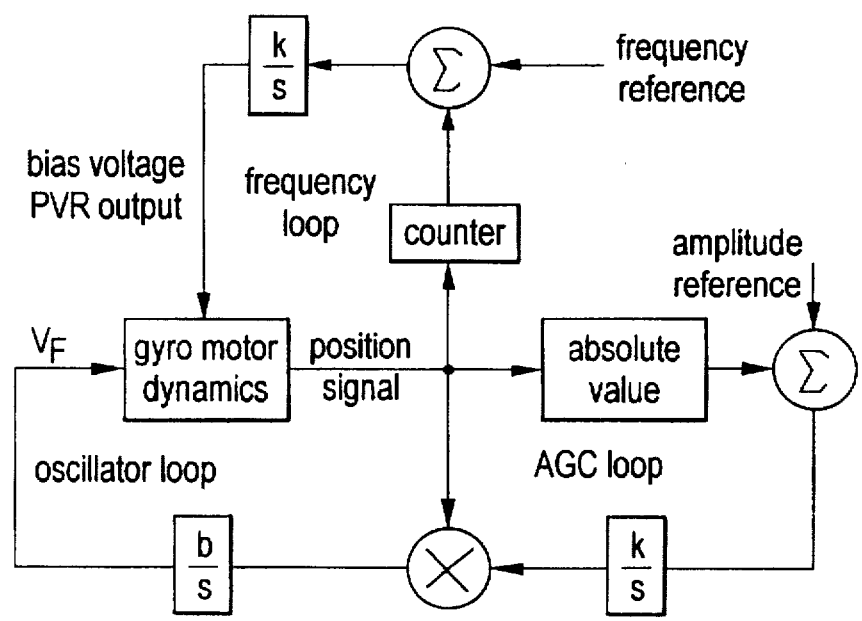
FIG. 6 is a block diagram of a simplified precision voltage reference according to the present invention.

With reference to FIG. 6, a simplified block diagram of the electronics required to implement a Y axis PVR according to the present invention is disclosed. The proof mass position signal, which is an AC signal at the oscillator eigenfrequency and is detected by the Y axis sense plates, is gained and integrated (or differentiated) to achieve proper phase for sustained oscillation. The resulting voltage is applied to the Y axis forcer plates which excites the oscillator dynamics as a fundamentally second order system. Since resonant frequency depends on the drive amplitude, an automatic gain control (AGC) loop is included. The absolute value or magnitude of the position signal is compared to a reference which adjusts the forcing voltage so that constant amplitude is maintained. The eigenfrequency depends on the bias voltage applied to the electrodes. This bias voltage is controlled by comparing the frequency of the Y axis position signal to a known frequency standard. Phase locked loops or counters can also be applied in alternative embodiments.

In a further embodiment of the present invention, torque electrodes are disposed next to (shown in FIG. 3 as coincident with the anchors 30), inside or outside the sense electrodes 16 to apply forces to the proof mass 12. These torque voltages can be: 1) the torque bias, which may differ from the sense bias, plus a drive voltage at the eigenfrequency; 2) the torque bias plus a drive voltage at half resonance; or 3) two separate frequencies as used in the gyroscope drive. For the sense, or Y, axis PVR, bias equivalent to the sense bias plus drive voltage is the most attractive because the small voltage required to probe the resonance does not alter the eigenfrequency.

In a further embodiment of the present invention, temperature control or compensation is provided in order to achieve the desired frequency stability of 0.3 ppm.

The resonant frequency and hence the controlled voltage stability depends upon the amplitude of the oscillation and also on the voltage applied to the drive electrodes. Consider the stability required of the oscillating position. When the two proof masses 12 are balanced, the sense force versus displacement includes a cubic term along with the desired negative linear spring, which contributes to the resonant frequency. At motion which is 1% of the air gap and at 16 V sense excitation, the ratio of electrical to total stiffness is the cubic term, which contributes a frequency shift of $8.2 \times 10^{-5}$ times the nominal resonant frequency. With reference to Eq. 2, if the drive voltage amplitude is maintained to 1000 ppm (1 μV), the frequency shifts 0.16 ppm ($2 \times 8.2 \times 10^{-5} \times 0.001$). Since the drive voltage is 1 mV, voltage dividers enable the required 1 μV stability.

Any voltages applied to drive the proof mass can alter the resonant frequency. The proof mass must be driven to probe for the resonant frequency. Consider the previous parameters with bias plus drive voltage. With 16 V applied to bias the sense axis force and sense electrodes, 1 mV drive voltage moves the sense axis 1% of the 2.5 μm nominal gap. The area of the torque electrodes is 10% that of the sense plus torque electrodes. The DC force and stiffness generated by the probe signal is only $2.0 \times 10^{-10}$ that of the bias signal ($(0.001/16)^2 \times 0.1/2$) so that the probe voltage can change and the PVR will satisfy its 0.2 ppm voltage stability (0.32 ppm frequency stability) requirement.

As a second option, consider drive frequency at half the eigenfrequency. The cos 2 ωt is at the sense eigenfrequency (eq. 10). To achieve motion of 1% of the air gap with the torque electrode 10% the proof mass area, the drive voltage must be 0.25 V. The DC force and stiffness generated by the probe signal is $1.3 \times 10^{-5}$ ($(0.25/16)^2 \times 0.1/2$) that generated by the bias signal. With modest pressure stability, the drift of the probe signal should be adequate to control precisely the bias signal. The size of the first harmonic compared to the cos 2 ωt term must be considered in oscillator design. Half-frequency drive is taught in U.S. Pat. No. 5,481,914 to Ward, "Electronics for Coriolis Force and Other Sensors."

A second PVR employs X axis motion, or motion parallel to the substrate, as shown in FIG. 5. The gyroscope drive motion is excited by the outer fixed comb drive fingers 22a and detected by the inner fixed comb fingers 22b. As the proof mass X amplitude increases, tension in the beams 36 increases so that the stiffness becomes nonlinear. The resonant frequency increases with drive amplitude which is determined by the drive voltage. Because the resonant frequency and drive amplitude are intimately linked, damping resulting from ambient pressure must be tightly controlled so that the drive amplitude and resonant frequency do not vary. As a result, the X axis PVR is considered less desirable than the Y axis PVR. Unlike the sense or Y axis PVR, the eigenfrequency cannot be set independently of motion amplitude.

In one embodiment of a drive axis PVR, a half-frequency drive, such as that taught in the above-referenced patent, establishes the motion amplitude so the resonant frequency depends only upon one voltage. The amplitude of the half-frequency drive can be the precisely controlled voltage reference. The half-frequency is obtained from a DC voltage by chopping with low leakage switches.

For a tuning fork gyro as depicted with half-frequency drive, 6 V of amplitude applied to the outer fixed comb fingers 22a results in 20 μm drive amplitude. 25.5 kHz small amplitude eigenfrequency increases to 29.7 kHz and the change in eigenfrequency with drive amplitude is 2360 Hz/V. According to the following equation:

$$\frac{\Delta f}{f} = \frac{6V \times 0.2\text{ppm} \times 2360 \frac{\text{Hz}}{V}}{29.7\text{kHz}} = 0.095\text{ppm} \tag{4}$$

the required frequency stability is 0.095 ppm.

Since the change in voltage is seen as a change in motion amplitude which alters resonant frequency, the precision voltage control is the amplitude control loop. Motion amplitude cannot be controlled independently of eigenfrequency. If the pressure and damping constant change 0.1%, the motor drive force must also change 0.1% to maintain amplitude. With half-frequency drive, the reference voltage changes 0.05%. The drive axis PVR therefore requires excellent control of damping and hence ambient pressure.

The following is a discussion of changes in beam eigenfrequency with temperature.

Consider a proof mass supported by beams built-in at either end. This is similar to the tuning fork gyro of FIG. 5 with the base beam 34 not moving, the nominal situation for drive axis dynamics. Thermal expansion coefficient difference between the substrate 14 and the silicon parts results in axial strains in the suspension beams. Because the beams are rectangular, the changes in resonant frequencies for the sense and drive axes differ so that only one axis will be thermally insensitive. The following analysis calculates stiffness with tension based on straight suspension beams. Except for the stress reduction factor, the base region is omitted from the natural frequency calculation, a first approximation. The axial load in one suspension beam is estimated from:

$$P = S_{red}(\alpha_{sbst} - \alpha)\Delta T_g \left[ \frac{1}{2} (l + l_m) - l_t \right] \frac{Ewt}{l/2} \quad (5)$$

where $\alpha_{sbst}$=thermal expansion coefficient of the substrate.
  $\alpha$=thermal expansion coefficient of silicon
  $l_m$=proof mass length
  $l_t$=length of torsion bar
  $\Delta T_g$=change in gyro temperature
  $S_{red}$=stress reduction afforded by the suspension (the base is compliant)

With axial tension P, the X direction force is related to displacement by:

$$\frac{F}{x} = \frac{2NkP}{\frac{kl}{2} - \frac{2}{\tanh\left(\frac{kl}{2}\right)} + \frac{2}{\sinh\left(\frac{kl}{2}\right)}} \quad (6)$$

where $$k = \sqrt{\frac{P}{EI}}$$

and I=area moments of inertia

Expand (6) in a Taylor series around P=0. For a single proof mass with 2N beams of length l/2 with two built-in ends, the force required to achieve a displacement x is:

$$\frac{F}{x} = 2N \left[ \frac{12EI}{(l/2)^3} + \frac{6P}{5(l/2)} - \frac{(l/2)P^2}{700EI} + \ldots \right] \quad (7)$$

where I=the area moment of inertia for one beam

In (7), the first term is the stiffness calculated from simple beam theory without axial tension. The entire expression is the stiffness with axial load. For silicon, the Young's modulus decreases with temperature, roughly −100 ppm/°C. The substrate should have higher expansion coefficient than the silicon so that the load applied to the beams is positive, opposite in sign to the linear term. Neglecting the $P^2$ terms and using $I=bh^3/12$ and $P=Ebh$ e where e is the axial strain:

Treat $E$ 32 $E + \Delta E$ and e as first order terms and neglect $$\frac{F}{x} = 2N \frac{bhE}{l/2} \left[ \left( \frac{2h}{l} \right)^2 + \frac{6e}{5} \right] \quad (8)$$

second order terms. For silicon the thermal expansion coefficient of silicon is 2.5 ppm/°C. and is neglected. With the incremental terms, the stiffness is:

$$\frac{F}{x} = \frac{24NEI}{(l/2)^3} + 2N \frac{bhE}{l/2} \left[ \frac{\Delta E}{E} \left( \frac{2h}{l} \right)^2 + \frac{6e}{5} \right] \quad (9)$$

For the tuning fork gyro of FIGS. 3 and 5, h is 5 to 8 µm for drive and sense axes respectively. The length is 400 µm so that the first term in brackets is −0.06 to −0.16 ppm/°C. The differential thermal expansion between silicon and glass is of the order of +1 ppm/°C.; thus strain relief as provided is required to cancel the variation in stiffness with frequency.

The following is a discussion of sense axis electrostatic relationships.

As a starting point, consider the force and stiffness aspects of the tuning fork gyro 10 of FIG. 3. If the proof mass is grounded and a bias voltage is applied to the sense electrode, an electrostatic force is applied to the proof mass. For parallel plates, the force on the proof mass is described by:

$$F = F_e + F_m = -\frac{\epsilon_o A V^2}{2(h+y)^2} - k_m y \quad (10)$$

where h=nominal air gap
  y=deviation of air gap from nominal, the vertical motion of the proof mass
  $\epsilon_o$=permittivity of low pressure air (8.85×10$^{-12}$ F/m)
  A=area of plates
  V=voltage applied to the electrode
  $k_m$=mechanical stiffness
  $F_e$=electrostatic force
  $F_m$=mechanical force from suspension springs The negative sign for the electrostatic force indicates that the proof mass is pulled toward the electrode since $h+y \geq 0$. Differentiating (10), the stiffness is given by:

$$k_n = -\frac{\partial F}{\partial y} = -\frac{\epsilon_o A V^2}{(h+y)^3} + k_m \quad (11)$$

The effective stiffness and, hence, the resonant frequency are modified by the electrostatic forces which depend on the bias voltage V. With small bias voltage, the proof mass deviates little from the nominal gap h. As V increases, static balance (10) dictates that the proof mass move closer to the electrode; that is, the displacement y is negative. As the voltage increases and the air gap (h +y) decreases, the force (10) and the stiffness (11) equal zero when the bias voltage and the displacement are:

$$V_{snap} = \sqrt{\frac{k_m}{\epsilon_o A} \left( \frac{2h}{3} \right)^3} \quad (12)$$

$$y = -\frac{h}{3} \quad (13)$$

For larger voltage, the system is unstable and the mass "snaps down" into contact with the electrode.

For the Y axis PVR, the following shows that electric field non-linear behavior does not result in excessive PVR error. Besides the bias (the precision reference), a drive voltage must be applied to excite or probe the resonant frequency. As previously suggested in FIG. 3, assume that the proof mass is biased at $V_B$ and that a drive voltage is applied at frequency ω. The electric field force is:

$$F_e = -\frac{\epsilon_o A_T [V_B + V_D \sin\omega t]^2}{2(h+y)^2} - \frac{\epsilon_o A_S V_B^2}{2(h+y)^2} \quad (14)$$

Rearranging (14)

$$F_e = -\frac{\epsilon_o(A_T + A_S)V_B^2 + \epsilon_o A_T \left[ \frac{V_D^2}{2} + 2V_B V_D \sin\omega t - \frac{V_D^2}{2} \cos 2\omega t \right]}{2(h+y)^2} \quad (15)$$

where $A_s$=area sense electrode
  $A_T$=area torque electrode
  $V_B$=bias voltage
  $V_D$=drive voltage Using the foregoing, the frequency variation from nonlinear stiffness is analyzed by expanding the position terms in the denominator of (15) into the following power series:

$$\frac{1}{h^2(1+\tilde{h})^2} = \frac{1}{h^2}[1 - 2\tilde{h} + 3\tilde{h}^2 - 4\tilde{h}^3 + \ldots] \quad (16)$$

The quadratic terms cancel by push-pull and do not contribute to resonant frequency. For small changes in resonant frequency $\Delta\omega$, the change in resonant frequency caused by the cubic in (16) is given by equation (2).

These and other examples of the invention illustrated above are intended by way of example and the actual scope of the invention is to be determined from the following claims.

What is claimed is:

1. A reference oscillator having an inherent stability against temperature change, employing a micromechanical, silicon tuning fork gyroscope disposed on a glass substrate and having a proof mass translated by a force electrode and sensed by a sense electrode, said oscillator comprising:

a voltage source proximate said gyroscope providing a voltage signal to said force electrode; and sense electronics proximate said gyroscope and in communication with said sense electrode for receiving a proof mass motion signal and for providing a reference frequency extracted therefrom.

2. The oscillator according to claim 1, further comprising a gain control circuit in communication with said voltage source.

3. A precision voltage reference having an inherent insensitivity to radiation, employing a micromechanical, silicon tuning fork gyroscope disposed on a glass substrate and having a proof mass translated by a force electrode and sensed by a sense electrode, said voltage reference comprising:

a frequency generator proximate said gyroscope for providing a reference frequency;

a voltage source proximate said gyroscope providing a voltage signal to said force electrode; and sense electronics proximate said gyroscope and in communication with said sense electrode for receiving a proof mass motion signal, for receiving said reference frequency from said frequency generator, and for generating a difference signal between said proof mass motion signal and said reference frequency, wherein said voltage source receives said difference signal and adjusts said voltage signal based thereupon, said voltage source providing said voltage signal as a voltage reference.

4. A micromechanical, thermally insensitive and radiation hard reference device fabricated from a micromechanical silicon-on-glass structure comprising:

a substantially planar glass substrate;

at least one silicon anchor disposed on said substrate;

a plurality of silicon beams extending from said at least one anchor and parallel to said substrate;

a first weighted element suspended from said plurality of beams above said substrate and relocatable along a first axis substantially orthogonal to said planar substrate;

a force electrode disposed on said substrate, substantially beneath said first weighted element;

a first electrical signal source in electrical communication with said force electrode for providing a first alternating potential between said force electrode and said first weighted element to cause said first weighted element to oscillate along said first axis;

a sense electrode disposed proximate said force electrode on said substrate, substantially beneath said first weighted element; and a first frequency module proximate said reference device and receiving an electrical signal from said sense electrode reflective of capacitive fluctuations between said sense electrode and said first weighted element during relocation of said first weighted element along said first axis, said first frequency module providing a first measured frequency equivalent to the frequency of sensed capacitive fluctuations.

5. The reference device according to claim 4, further comprising:

a first frequency comparator in communication with said first frequency module for comparing said first measured frequency with a reference frequency and for providing an offset signal to said first electrical signal source, wherein said first electrical signal source provides said first alternating potential as a first reference voltage.

6. The reference device according to claim 4, further comprising a gain control circuit in communication with said first electrical signal source.

7. The reference device according to claim 4, further comprising:

a second weighted element suspended from said plurality of beams above said substrate and translatable along a second axis substantially orthogonal to said first axis and parallel said substrate;

a set of driven finger electrodes projecting from said second weighted element substantially parallel said second axis;

a set of drive finger electrodes substantially parallel to and freely meshing with a first subset of said set of driven finger electrodes;

a second electrical signal source in electrical communication with said first subset of driven finger electrodes and said set of drive finger electrodes for providing a second alternating potential between said driven and drive finger electrodes to induce vibration of said second weighted element along said second axis;

a set of sense finger electrodes substantially parallel to and freely meshing with a second subset of said driven finger electrodes; and a second frequency module proximate said reference device and receiving an electrical signal from said sense finger electrodes reflective of capacitive fluctuations between said sense finger electrodes and said second subset of driven finger electrodes during said vibration of said second weighted element along said second axis, said second frequency module providing a second measured frequency equivalent to the frequency of sensed capacitive fluctuations.

8. The reference device according to claim 7, further comprising:

a second frequency comparator in communication with said second frequency module for comparing said second measured frequency with a reference frequency and for providing an offset signal to said second electrical signal source, wherein said second electrical signal source provides said second alternating potential as a second reference voltage.

9. The reference device according to claim 7, further comprising a gain control circuit in communication with said second electrical signal source.

10. The reference device according to claim 7, wherein said first and second weighted elements are each comprised of complimentary left and right portions parallel to said substrate.

11. A micromechanical reference frequency device comprising:

a substantially planar glass substrate;

a micromechanical tuning fork gyroscope disposed on said substrate, said tuning fork comprising a plurality of silicon anchors disposed on said substrate, a plurality of silicon beams extending from said plurality of anchors, parallel to said substrate, first and second weighted elements each suspended from respective ones of said plurality of beams above said substrate, said weighted elements rotatable about a first axis parallel and above said substrate, at least one force electrode disposed on said substrate under each of said first and second weighted elements, and at least one sense electrode disposed on said substrate under each of said first and second weighted elements;

a first source of electrical bias in communication with said force electrodes for establishing an alternating bias between each of said weighted elements and respective force electrodes for oscillating said weighted elements about said first axis; and a first frequency module in communication with said sense electrodes for determining a frequency of capacitive fluctuation between said weighted elements and respective sense electrodes during oscillation of said weighted elements about said first axis and for providing a first measured frequency reflective of said capacitive fluctuation.

12. The reference device according to claim 11, wherein said first and second weighted elements are further translatable along a second axis substantially orthogonal to said first axis and parallel said substrate.

13. The reference device according to claim 12, further comprising:

a set of driven finger electrodes projecting from each of said weighted elements substantially parallel said second axis;

a set of drive finger electrodes, disposed on drive anchors attached to said substrate, said drive finger electrodes substantially parallel to and freely meshing with a first subset of said set of driven finger electrodes;

a second source of electrical bias in communication with said first subset of driven finger electrodes and said set of drive finger electrodes for providing an alternating bias between said driven and drive finger electrodes for translating said weighted elements along said second axis;

a set of sense finger electrodes, disposed on sense anchors attached to said substrate, said sense finger electrodes substantially parallel to and freely meshing with a second subset of said driven finger electrodes;

a second frequency module in communication with said set of sense finger electrodes for determining a frequency of capacitive fluctuation between said set of sense electrodes and said second subset of said driven finger electrodes during translation of said weighted elements along said second axis and for providing a second measured frequency reflective of said capacitive fluctuation.

14. A micromechanical reference voltage device comprising:

a substantially planar glass substrate;

a micromechanical tuning fork gyroscope disposed on said substrate, said tuning fork comprising a plurality of silicon anchors disposed on said substrate, a plurality of silicon beams extending from said plurality of anchors, parallel to said substrate, first and second weighted elements each suspended from respective ones of said plurality of beams above said substrate, said weighted elements rotatable about a first axis parallel and above said substrate, at least one force electrode disposed on said substrate under each of said first and second weighted elements, and at least one sense electrode disposed on said substrate under each of said first and second weighted elements;

a first source of electrical bias in communication with said force electrodes for establishing an alternating bias between each of said weighted elements and respective force electrodes for oscillating said weighted elements about said first axis;

a first frequency module in communication with said sense electrodes for determining a frequency of capacitive fluctuation between said weighted elements and respective sense electrodes during oscillation of said weighted elements about said first axis and for providing a first measured frequency reflective of said capacitive fluctuation; and a first frequency comparator for comparing said first measured frequency with a frequency standard and for providing said first source of electrical bias with a first feedback signal.

wherein said first source of electrical bias provides a first bias standard.

15. The reference device according to claim 14, wherein said first and second weighted elements are further translatable along a second axis substantially orthogonal to said first axis and parallel said substrate.

16. The reference device according to claim 15, further comprising:

a set of driven finger electrodes projecting from each of said weighted elements substantially parallel said second axis;

a set of drive finger electrodes, disposed on drive anchors attached to said substrate, said drive finger electrodes substantially parallel to and freely meshing with a first subset of said set of driven finger electrodes;

a second source of electrical bias in communication with said first subset of driven finger electrodes and said set of drive finger electrodes for establishing an alternating bias between said driven and drive finger electrodes for translating said weighted elements along said second axis;

a set of sense finger electrodes, disposed on sense anchors attached to said substrate, said sense finger electrodes substantially parallel to and freely meshing with a second subset of said driven finger electrodes;

a second frequency module in communication with said set of sense finger electrodes for determining a frequency of capacitive fluctuation between said set of sense electrodes and said second subset of said driven finger electrodes during translation of said weighted elements along said second axis and for providing a second measured frequency reflective of said capacitive fluctuation; and a second frequency comparator for comparing said second measured frequency with a frequency standard and for providing said second source of electrical bias with a second feedback signal, wherein said second source of electrical bias provides a second bias standard.

* * * * *

UNITED STATES PATENT AND TRADEMARK OFFICE
CERTIFICATE OF CORRECTION

PATENT NO. : 5,783,973
DATED : July 21, 1998
INVENTOR(S) : Marc S. Weinberg, et al.

It is certified that error appears in the above-identified patent and that said Letters Patent is hereby corrected as shown below:

Column 9, line 48, "E 32 E" should read --E = E--.

Signed and Sealed this

Second Day of November, 1999

Attest:

Q. TODD DICKINSON

*Attesting Officer*    *Acting Commissioner of Patents and Trademarks*